United States Patent
Fukushi et al.

(10) Patent No.: US 9,251,886 B2
(45) Date of Patent: Feb. 2, 2016

(54) SEMICONDUCTOR STORAGE DEVICE

(71) Applicant: Renesas Electronics Corporation, Kanagawa (JP)

(72) Inventors: Tetsuo Fukushi, Kanagawa (JP); Atsunori Hirobe, Kanagawa (JP); Toshikatsu Jinbo, Kanagawa (JP); Muneaki Matsushige, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/807,957

(22) Filed: Jul. 24, 2015

(65) Prior Publication Data

US 2015/0332752 A1 Nov. 19, 2015

Related U.S. Application Data

(63) Continuation of application No. 14/082,320, filed on Nov. 18, 2013, now Pat. No. 9,123,391.

(30) Foreign Application Priority Data

Nov. 27, 2012 (JP) ................................ 2012-258669

(51) Int. Cl.
*G11C 5/02* (2006.01)
*G11C 11/4091* (2006.01)
*G11C 7/14* (2006.01)
*G11C 11/4097* (2006.01)

(52) U.S. Cl.
CPC .............. *G11C 11/4091* (2013.01); *G11C 5/02* (2013.01); *G11C 7/14* (2013.01); *G11C 11/4097* (2013.01)

(58) Field of Classification Search
CPC .. G11C 11/4091; G11C 11/4097; G11C 5/02; G11C 7/14
USPC ............................. 365/51, 63, 189.08, 210.3
See application file for complete search history.

(56) References Cited

U.S. PATENT DOCUMENTS

| | | | |
|---|---|---|---|
| 6,459,642 B1 | 10/2002 | Cho et al. | |
| 7,366,005 B2 | 4/2008 | Koide | |
| 7,478,358 B2 | 1/2009 | Fujimoto | |
| 7,649,760 B2 * | 1/2010 | Hong | G11C 11/4091 365/205 |
| 7,710,808 B2 | 5/2010 | Kushida et al. | |
| 7,864,555 B2 * | 1/2011 | Inage | G11C 5/025 29/592.1 |
| 7,903,449 B2 * | 3/2011 | Kajigaya | G11C 7/02 365/149 |
| 8,045,389 B2 | 10/2011 | Kanehara et al. | |
| 8,050,127 B2 * | 11/2011 | Lee | G11C 7/02 365/189.03 |
| 8,482,951 B2 * | 7/2013 | Yi | G11C 7/062 365/149 |
| 8,499,272 B2 * | 7/2013 | Ishii | H01L 27/0207 716/119 |
| 8,508,987 B2 | 8/2013 | Tsuji et al. | |
| 8,797,778 B2 * | 8/2014 | Ohgami | G11C 5/025 365/53 |
| 8,847,402 B2 | 9/2014 | Funane | |
| 8,884,349 B2 | 11/2014 | Miura | |
| 9,123,391 B2 * | 9/2015 | Fukushi | G11C 5/02 |

FOREIGN PATENT DOCUMENTS

JP 10-303389 A 11/1998
JP 2001-210100 A 8/2001

* cited by examiner

*Primary Examiner* — Viet Q Nguyen
(74) *Attorney, Agent, or Firm* — Sughrue Mion, PLLC

(57) ABSTRACT

A semiconductor storage device 1 according to an aspect includes a first memory area 11_1 and a second memory area 11_2. Memory cells MC_m_n and bit lines BL1, BL2_, ..., BLm_ are disposed in a boundary area 18 between the first and second memory areas 11_1 and 11_2. The memory cells MC_m_n disposed in the boundary area 18 includes memory cells into which no data is written, and a line 56 is formed in a place that overlaps memory cells disposed in the boundary area 18 when the boundary area 18 is viewed from the top. As a result, it is possible to increase the integration density of a memory cell array and provide a line in the memory cell array.

5 Claims, 7 Drawing Sheets

SEMICONDUCTOR STORAGE DEVICE

CROSS-REFERENCE TO RELATED APPLICATIONS

This application is a continuation of U.S. application Ser. No. 14/082,320 filed on Nov. 18, 2013, which is based upon and claims the benefit of priority from Japanese patent application No. 2012-258669, filed on Nov. 27, 2012, the disclosures of which are incorporated herein in their entirety by reference.

BACKGROUND

The present invention relates to a semiconductor storage device, and in particular to a semiconductor storage device including a plurality of memory areas.

In recent years, capacities of semiconductor storage devices such as DRAMs (Dynamic Random Access Memories) are becoming larger and larger. As a result, it is necessary to increase the integration densities of memory cell arrays in order to increase the capacities and reduce the costs even further.

Japanese Unexamined Patent Application Publication No. 10-303389 discloses a technique for effectively increasing the current capacity or the number of power-supply lines or signal lines, and thereby for improving the performance of peripheral circuits and/or the flexibility of wiring layout design. Japanese Unexamined Patent Application Publication No. 2001-210100 discloses a technique relating to a semiconductor storage device capable of detecting a failure in a dummy cell or on a dummy word line, and thereby improving the productivity.

SUMMARY

The present inventors have found the following problem. As explained above in the BACKGROUND section, the capacities of semiconductor storage devices are becoming larger and larger. As a result, it is necessary to increase the integration densities of memory cell arrays in order to increase the capacities and reduce the costs even further. To increase the capacity, it is necessary to increase the current capacity of power-supply lines or signal lines. However, there is a problem that if a new wiring area is provided to enhance power-supply lines or signal lines, the chip becomes larger in size.

Other problems to be solved as well as novel features will be more apparent from the following description and the accompanying drawings.

A first aspect of the present invention is a semiconductor storage device including a first memory area and a second memory area. A memory cell and a bit line are disposed in a boundary area between the first and second memory areas. The memory cell disposed in the boundary area includes a memory cell into which no data is written, and a line is formed in a place that overlaps the memory cell disposed in the boundary area when the boundary area is viewed from the top.

According to the above-described aspect, it is possible to provide a semiconductor storage device capable of increasing the integration density of a memory cell array and providing a line in the memory cell array.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
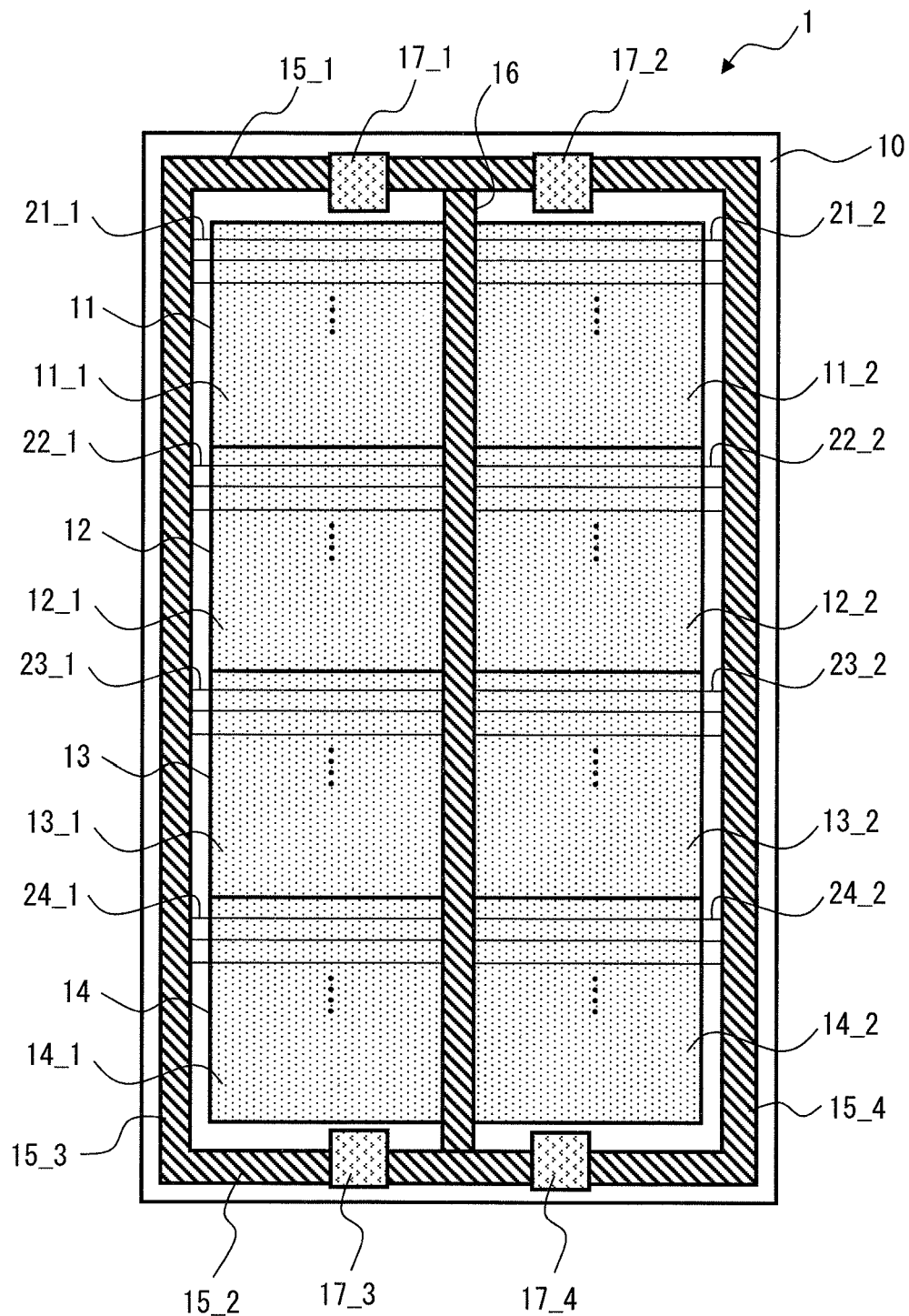
FIG. 1 shows a configuration of a semiconductor storage device according to a first embodiment.

A first embodiment is explained hereinafter with reference to the drawings. FIG. 1 shows a configuration of a semiconductor storage device according to a first embodiment. As shown in FIG. 1, in the semiconductor storage device 1 according to this embodiment, a plurality of memory mats 11 to 14 (each of which is represented by dots) are disposed on a substrate 10. Power-supply trunk lines 15_1 to 15_4 are disposed on the periphery of the memory mats 11 to 14. The power-supply trunk lines 15_1 to 15_4 are electrically connected with each other. The power-supply trunk lines 15_1 to 15_4 are lines for supplying electric power to each of the memory mats 11 to 14. The power-supply trunk lines 15_1 to 15_4 are supplied with electric power from a power-supply line(s) disposed in another wiring layer(s) (not shown) through vias 17_1 to 17_4.

Further, a power-supply line 16 that electrically connects the power-supply trunk line 15_1 with the power-supply trunk line 15_2 is disposed between the power-supply trunk lines 15_1 and 15_2. The power-supply line 16 is disposed so as to pass through the center of each of the memory mats 11 to 14. That is, the memory mat 11 includes a memory area 11_1 and a memory area 11_2, and the power-supply line 16 is disposed so as to pass between the memory areas 11_1 and 11_2. Similarly, the memory mats 12 to 14 include memory areas 12_1 to 14_1 respectively and memory areas 12_2 to 14_2 respectively, and the power-supply line 16 is disposed so as to pass between the memory areas 12_1 to 14_1 and the memory areas 12_2 to 14_2.

Further, a plurality of power-supply lines 21_1 for supplying electric power to the memory area 11_1 are disposed in a place corresponding to the memory area 11_1. The power-supply lines 21_1 are electrically connected to the power-supply trunk line 15_3 and the power-supply line 16. Similarly, a plurality of power-supply lines 21_2 for supplying electric power to the memory area 11_2 are disposed in a place corresponding to the memory area 11_2. The power-supply lines 21_2 are electrically connected to the power-supply trunk line 15_4 and the power-supply line 16. Further, power-supply lines 22_1 to 24_1 and 22_2 to 24_2 are disposed for the other memory areas 12_1 to 14_1 and 12_2 to 14_2 in a similar manner.

Figure 2A:
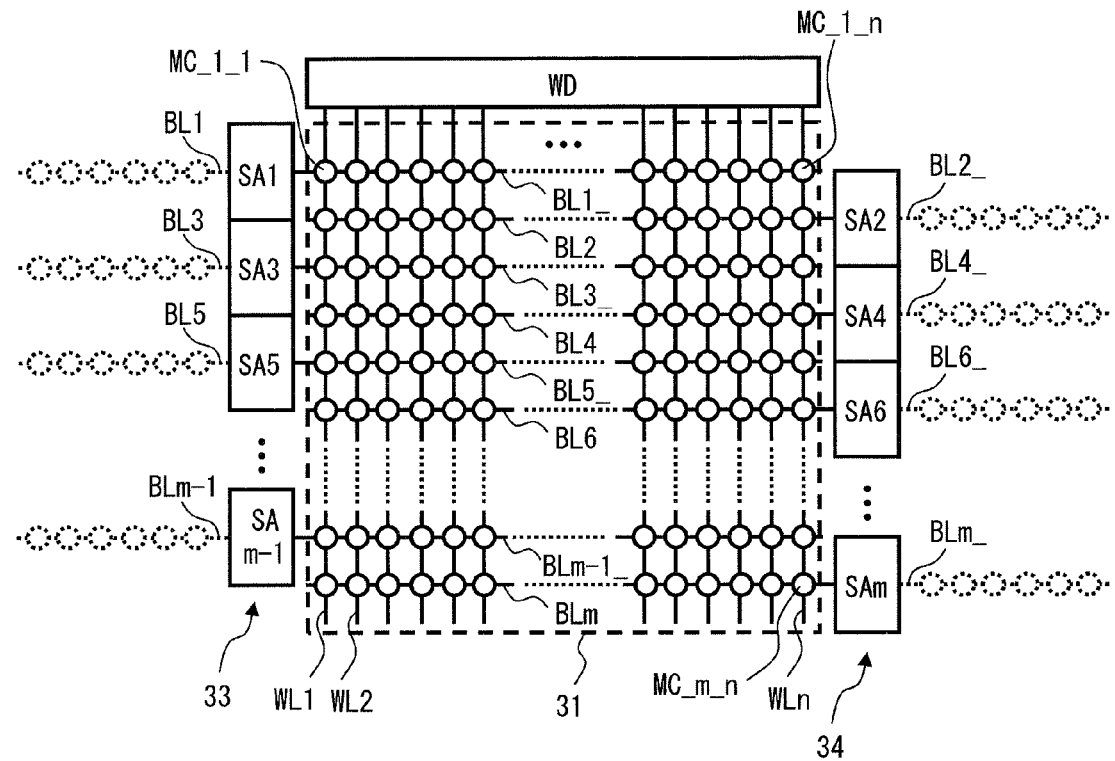
FIG. 2A shows one of unit memory cell arrays that form a semiconductor storage device according to a first embodiment.

FIG. 2A shows one of the unit memory cell arrays that constitute the semiconductor storage device according to this embodiment. Each of the memory mats 11 to 14 shown in FIG. 1 includes a plurality of unit memory cell arrays shown in FIG. 2A.

As shown in FIG. 2A, a unit memory cell array 31 (hereinafter, also referred to simply as "memory cell array") includes a plurality of memory cells MC_1_1 to MC_m_n, a plurality of bit lines BL1_, BL2, ..., BLm, and a plurality of word lines WL1 to WLn. Each of the plurality of memory cells MC_1_1 to MC_m_n is disposed in a place at which one of the bit lines intersects one of the word lines. Note that m and n are arbitrary natural numbers. The number m corresponds to the number of bit lines, and the number n corresponds to the number of word lines. In this example, the number of memory cells disposed in the unit memory cell array 31 is expressed as "m×n".

The plurality of bit lines BL1_, BL2, ..., BLm are connected to sense amplifier groups 33 and 34 disposed on both sides of the unit memory cell array 31. A pair of bit lines BL1 and BL1_ are connected to both sides of a sense amplifier SA1, and the memory cells MC_1_1 to MC_1_n of the unit memory cell array 31 are connected to the bit line BL_.

The semiconductor storage device 1 according to this embodiment is an open bit-line type semiconductor storage device in which bit lines are disposed on both sides of sense amplifiers. In this specification, of the bit line pair BLm, the bit line disposed on the left side of the sense amplifier SAm is referred to as "BLm" and the bit line disposed on the right side of the sense amplifier SAm is referred to as "BLm_".

Further, as shown in FIG. 2A, the odd-numbered sense amplifier groups 33 and the even-numbered sense amplifier groups 34 are arranged in a mutually staggered manner (i.e., alternately arranged). That is, the memory cells MC_1_1 to MC_1_n disposed in the first row of the unit memory cell array 31 are connected to the odd-numbered sense amplifier SA1. The memory cells MC_2_1 to MC_2_n disposed in the second row of the unit memory cell array 31 are connected to the even-numbered sense amplifier SA2. The memory cells MC_3_1 to MC_3_n disposed in the third row of the unit memory cell array 31 are connected to the odd-numbered sense amplifier SA3.

As described above, the memory cells disposed in the odd-numbered rows of the unit memory cell array 31 are connected to the odd-numbered sense amplifiers SA1, SA3, ..., SAm−1 and the memory cells disposed in the even-numbered rows are connected to the even-numbered sense amplifiers SA2, SA4, ..., SAm. With this configuration, the sense amplifiers SA1 to SAm can be arranged in a mutually staggered manner.

Figure 2B:
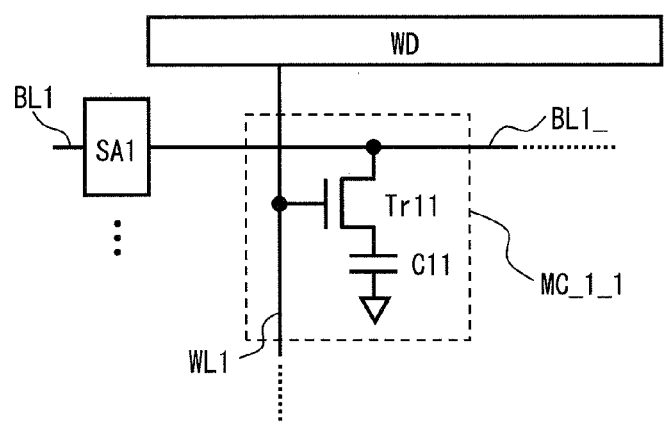
FIG. 2B is a circuit diagram showing an example of a memory cell.

Further, the plurality of word lines WL1 to WLn are connected to a word-line drive circuit WD disposed on the periphery of the unit memory cell array 31. Each of the memory cells MC_1_1 to MC_m_n includes, for example, one transistor and one capacitor. FIG. 2B is a circuit diagram showing an example of such a memory cell. As shown in FIG. 2B, the memory cell MC_1_1 includes a transistor Tr11 and a capacitor C11. The word line WL1 is connected to the gate of the transistor Tr11. The bit line BL1_ is connected to the drain of the transistor Tr11. The source of the transistor Tr11 is connected to one end of the capacitor C11 and the other end of the capacitor C11 is connected to a low-potential side power-supply voltage VSS. Each of the other memory cells has a similar configuration. Note that the configuration of one of the unit memory cell arrays constituting the semiconductor storage device, shown in FIG. 2A is a mere example. For example, the arrangement of the sense amplifiers and the word-line drive circuit can be changed as desired.

In the unit memory cell array 31 shown in FIG. 2A, for example, when data is written into the memory cell MC_1_1, the sense amplifier SA1 raises or lowers the potential of the bit line BL1_ to a high level or a low level according to the data to be written. For example, when high-level data "1" is written into the memory cell MC_1_1, the sense amplifier SA1 raises the potential of the bit line BL1_ to a high level (high-potential side power-supply voltage VDD). On the other hand, when low-level data "0" is written into the memory cell MC_1_1, the sense amplifier SA1 lowers the potential of the bit line BL1_ to a low level (low-potential side power-supply voltage VSS).

Further, the word-line drive circuit WD brings the word line WL1 into an active state (for example, high level) and thereby turns on the transistor Tr11 of the memory cell MC_1_1. As a result, the bit line BL1_ is electrically connected to the capacitor C11 of the memory cell MC_1_1, and the capacitor C11 is thereby charged to the potential corresponding to the potential of the bit line BL1_. After that, the word-line drive circuit WD brings the word line WL1 into an inactive state (for example, low level) and thereby turns off the transistor Tr11 of the memory cell MC_1_1. By the operation like this, the capacitor C11 of the memory cell MC_1_1 stores high-level data or low-level data.

The data written into the memory cell MC_1_1 in the above-described manner can be read in the following manner. Firstly, the sense amplifier SA1 pre-charges the bit line pair BL1 and BL1_ to a predetermined voltage. After that, the word-line drive circuit WD brings the word line WL1 into an active state and thereby turns on the transistor Tr11 of the memory cell MC_1_1. As a result, the bit line BL1_ is electrically connected to the capacitor C11 of the memory cell MC_1_1 and the potential (pre-charge voltage) of the bit line BL1_ changes according to the potential (the amount of accumulated electrical charge) of the capacitor C11. By detecting and amplifying this potential change of the bit line BL1_ by the sense amplifier SA1, the data written into the memory cell MC_1_1 can be determined. In this process, the potential of the bit line BL1 is used as a reference potential when the potential of the bit line BL1 is detected. In other words, the bit line BL1 is used to generate a reference signal when the sense amplifier SA1 reads data from the memory cell MC_1_1. Similarly, when data is read from or written into a memory cell connected to the bit line BL1, the bit line BL1_ serves as a reference bit line.

Next, a configuration in the vicinity of the power-supply line 16 of the semiconductor storage device 1 according to this embodiment is explained with reference to FIG. 3. Although the following explanation is made by using the configuration of the memory mat 11 as an example, the following explanation can be also applied to the configuration of each of the other memory mats 12 to 14.

Figure 3:
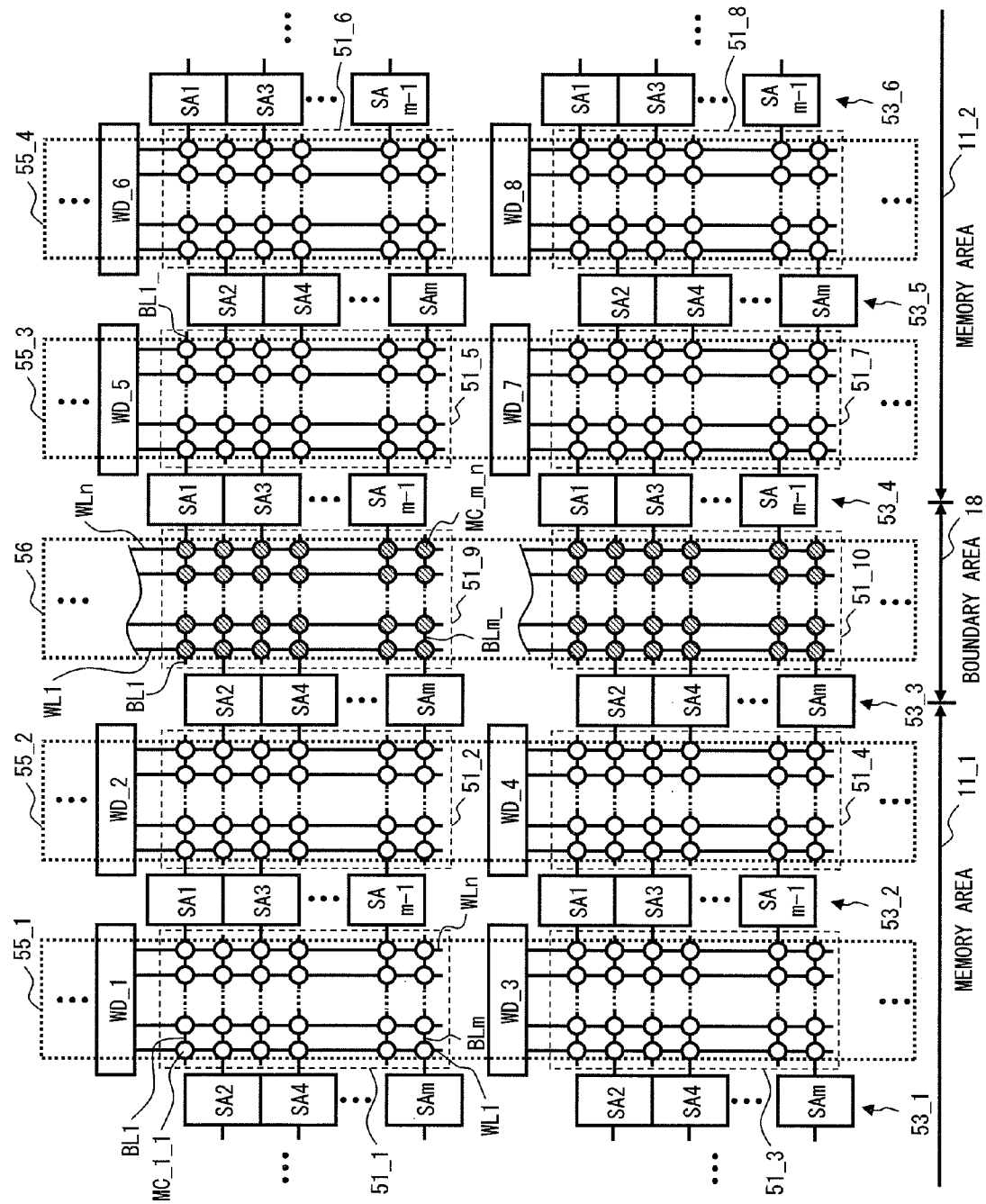
FIG. 3 shows a configuration of a semiconductor storage device according to a first embodiment.

As shown in FIG. 3, each of the memory areas 11_1 and 11_2 includes sense amplifiers SA1 to SAm and memory cells MC_1_1 to MC_m_n disposed on both sided of the sense amplifiers SA1 to SAm. Further, each of the memory areas 11_1 and 11_2 includes bit line pairs BL1 to BLm and BL1_ to BLm_ that are connected to the memory cells MC_1_1 to MC_m_n and also connected to the sense amplifiers SA1 to SAm respectively on both sides of the sense amplifiers SA1 to SAm. That is, a plurality of unit memory cell arrays shown in FIG. 2A are disposed in each of the memory areas 11_1 and 11_2.

As shown in FIG. 3, a memory cell array 51_1 and a memory cell array 51_3 disposed in the memory area 11_1 (first memory area) are arranged side by side in the direction parallel to the word lines WL1 to WLn. Further, the memory cell arrays 51_1 and 51_3 are disposed so as to be sandwiched between a sense amplifier group 53_1 and a sense amplifier group 53_2. The word lines WL1 to WLn of the memory cell array 51_1 are connected to a word-line drive circuit WD_1. The word lines WL1 to WLn of the memory cell array 51_3 are connected to a word-line drive circuit WD_3.

Further, a line 55_1 is formed in a place corresponding to the memory cell arrays 51_1 and 51_3. The line 55_1 is formed in a different layer from the layer in which the memory cell arrays 51_1 and 51_3 are formed. For example, the line 55_1 is formed in a wiring layer that is formed above the layer in which the word lines WL1 to WLn and the bit lines BL1 to BLm and BL1_ to BLm_ are formed. The line 55_1 is formed so as to pass through the memory mats 11 to 14. For example, the line 55_1 is a signal line for supplying a word-line drive signal to the word-line drive circuits WD_1 and WD_3 (i.e., a plurality of word-line drive circuits arranged in the direction parallel to the word lines WL1 to WLn).

Similarly, a memory cell array 51_2 and a memory cell array 51_4 disposed in the memory area 11_1 are arranged side by side in the direction parallel to the word lines WL1 to WLn. Further, the memory cell arrays 51_2 and 51_4 are disposed so as to be sandwiched between a sense amplifier group 53_2 and a sense amplifier group 53_3. The word lines WL1 to WLn of the memory cell array 51_2 are connected to a word-line drive circuit WD_2. The word lines WL1 to WLn of the memory cell array 51_4 are connected to a word-line drive circuit WD_4.

Further, a line 55_2 is formed in a place corresponding to the memory cell arrays 51_2 and 51_4. The line 55_2 is formed in a different layer from the layer in which the memory cell arrays 51_2 and 51_4 are formed. For example, the line 55_2 is formed in a wiring layer that is formed above the layer in which the word lines WL1 to WLn and the bit lines BL1 to BLm and BL1_ to BLm_ are formed. The line 55_2 is formed so as to pass through the memory mats 11 to 14. For example, the line 55_2 is a signal line for supplying a word-line drive signal to the word-line drive circuits WD_2 and WD_4 (i.e., a plurality of word-line drive circuits arranged in the direction parallel to the word lines WL1 to WLn).

Memory cell arrays 51_5 and 51_7 and memory cell arrays 51_6 and 51_8 disposed in the memory area 11_2 (second memory area) are configured in a similar manner to the memory cell arrays disposed in the memory area 11_1. Similarly to the above-described configuration, a line 55_3 is formed in a place corresponding to the memory cell arrays 51_5 and 51_7. The line 55_3 is formed in a different layer from the layer in which the memory cell arrays 51_5 and 51_7 are formed. Similarly, a line 55_4 is formed in a place corresponding to the memory cell arrays 51_6 and 51_8. The line 55_4 is formed in a different layer from the layer in which the memory cell arrays 51_6 and 51_8 are formed.

Further, memory cell arrays 51_9 and 51_10 are disposed in a memory cell array end section in which the memory area 11_1 and the memory area 11_2 adjoin each other. The memory cell arrays 51_9 and 51_10 are arranged in side by side in the direction parallel to the word lines WL1 to WLn. Further, the memory cell arrays 51_9 and 51_10 are disposed so as to be sandwiched between a sense amplifier group 53_3 and a sense amplifier group 53_4.

In the boundary area 18 in which the memory cell arrays 51_9 and 51_10 are disposed, bit lines BL2_, BL4_, . . . , BLm_ (the bit lines BL2_, BL4_, . . . , BLm_ are connected to the memory area 11_2 side (right side in the figure) of respective sense amplifiers of the sense amplifier group 53_3) and memory cells MC_2_n, MC_4_n, . . . , MC_m_n are disposed. Further, in the boundary area 18, bit lines BL1, BL3, . . . , BLm−1 (the bit lines BL1, BL3, . . . , BLm−1 are connected to the memory area 11_1 side (left side in the figure) of respective sense amplifiers of the sense amplifier group 53_4) and memory cells MC_1_n, MC_3_n, . . . , MC_m−1_n are disposed (for the symbols, see also FIG. 2A).

The word lines WL1 to WLn of the memory cell arrays 51_9 and 51_10 disposed in the boundary area 18 are configured so that they are kept in an inactive state at all operation modes. Therefore, no data is written into each memory cell of the memory cell arrays 51_9 and 51_10 disposed in the boundary area 18. For example, the word lines WL1 to WLn of the memory cell arrays 51_9 and 51_10 can be kept in an inactive state at all operation modes by electrically connecting the word lines WL1 to WLn to a low-potential side power-supply line. Alternatively, the word lines WL1 to WLn of the memory cell arrays 51_9 and 51_10 may be connected to a word-line drive circuit (not shown) and thereby brought into an inactive state by using the word-line drive circuit (not shown). For example, the word lines WL1 to WLn of the memory cell arrays 51_9 and 51_10 can be brought into an inactive state by electrically connecting the word lines WL1 to WLn to a low-potential side power-supply line by using the word-line drive circuit. By keeping the word lines WL1 to WLn of the memory cell arrays 51_9 and 51_10 in an inactive state at all operation modes, the transistors constituting the memory cells can be kept in an off-state at all operation modes, and thus making it possible to prevent any data from being written into the memory cells.

That is, the bit lines BL1, BL2_, . . . , BLm_ of the memory cell arrays 51_9 and 51_10 disposed in the array end section of the memory cell arrays constituting the memory areas 11_1 and 11_2 are connected to the sense amplifiers SA1 to SAm. Therefore, the bit lines BL1, BL2_, . . . , BLm_ are used to generate reference signals when the sense amplifiers SA1 to SAm read data from the memory cell arrays 51_2, 51_4, 51_5 and 51_7.

For example, when data written into the memory cell MC_1_1 of the memory cell array 51_5 is read, the sense amplifier SA1 pre-charges the bit line BL1 disposed in the memory cell array 51_9 of the boundary area 18 and the bit line BL1_ disposed in the memory cell array 51_5 of the memory area 11_2 to a predetermined potential. After that, a word-line drive circuit WD_5 brings the word line WL1 into an active state and thereby turns on the transistor of the memory cell MC_1_1. As a result, the bit line BL1_ is electrically connected to the capacitor of the memory cell MC_1_1 and the potential (pre-charge voltage) of the bit line BL1_ changes according to the potential (the amount of accumulated electrical charge) of the capacitor. By detecting and amplifying a potential difference between this bit line BL1_ and the bit line BL1 of the boundary area 18 by the sense amplifier SA1, the data written into the memory cell MC_1_1 can be determined.

In this process, the potential of the bit line BL1 disposed in the memory cell array 51_9 of the boundary area 18 is used as a reference potential when the potential of the bit line BL1_ disposed in the memory cell array 51_5 of the memory area 11_2 is detected.

Further, a line 56 (first line) is formed in a place corresponding to the memory cell arrays 51_9 and 51_10 disposed in the boundary area 18. The line 56 is formed in a different layer from the layer in which the memory cell arrays 51_9 and 51_10 are formed. In other words, the memory cells disposed in the boundary area 18 include memory cells into which no data is written. Further, the line 56 is formed in a place that overlaps the memory cells disposed in the boundary area 18 when the boundary area 18 is viewed from the top.

For example, the line 56 is formed in a wiring layer that is formed above the layer in which the word lines WL1 to WLn and the bit lines BL1 to BLm and BL1_ to BLm_ are formed. Note that no data is written into the memory cell arrays 51_9 and 51_10 disposed in the boundary area 18. That is, the word lines WL1 to WLn of the memory cell arrays 51_9 and 51_10 disposed in the boundary area 18 are configured so that they are kept in an inactive state at all operation modes. Therefore, the line 56 does not need to be used as a signal line for driving any word-line drive circuit WD. Further, the line 56 is formed so as to pass through the memory mats 11 to 14. Therefore, in the semiconductor storage device 1 according to this embodiment, the line 56 can be used as the power-supply line 16 shown in FIG. 1. For example, the line 56 can be formed in the layer at the same level as the lines 55_1 and 55_2 formed in the memory area 11_1 and the lines 55_3 and 55_4 formed in the memory area 11_2.

Figure 4:
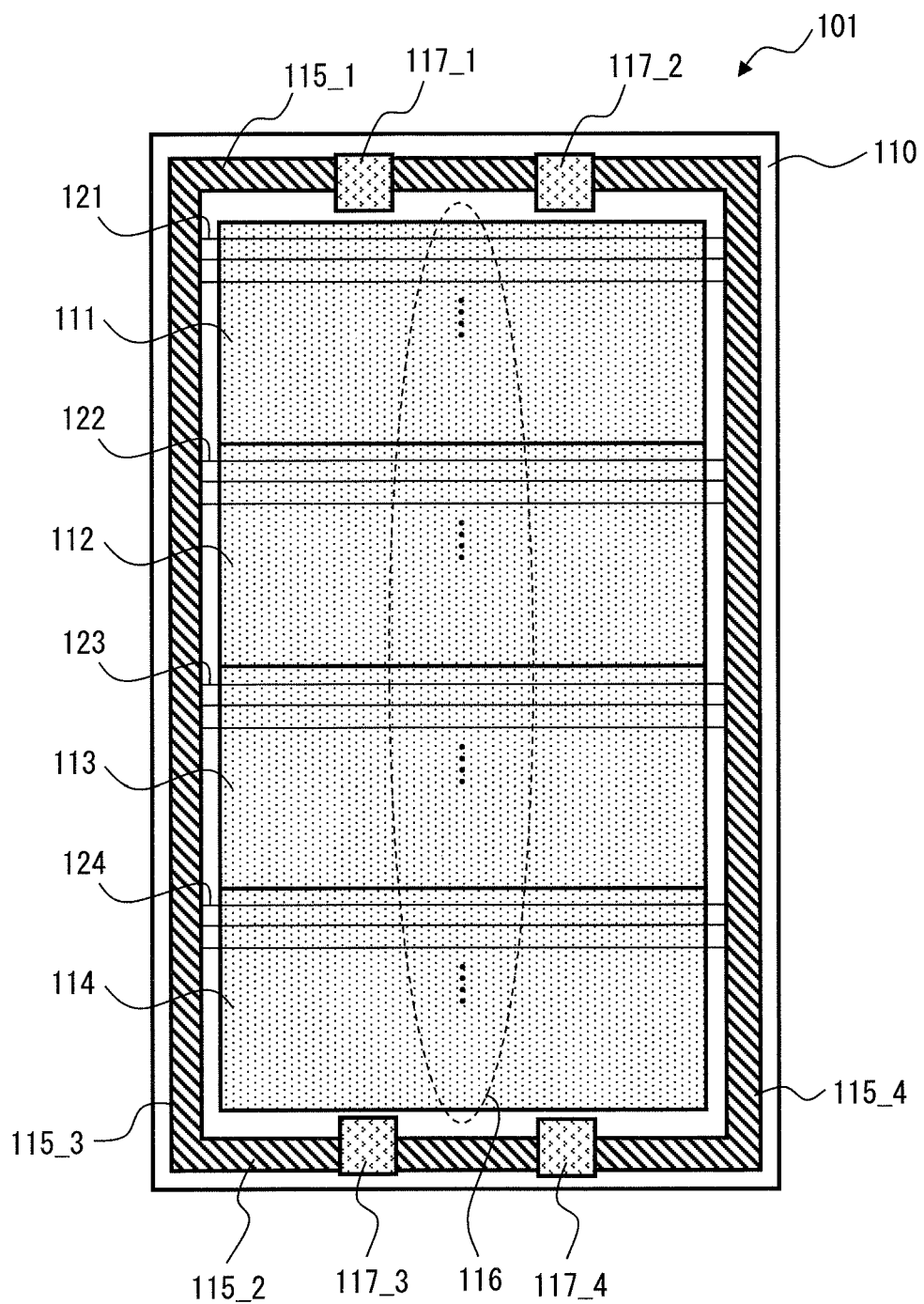
FIG. 4 shows a configuration of a semiconductor storage device according to a comparative example.

FIG. 4 shows a configuration of a semiconductor storage device 101 according to a comparative example. As shown in FIG. 4, in the semiconductor storage device 101, a plurality of memory mats 111 to 114 (each of which is represented by dots) are disposed on a substrate 110. Power-supply trunk lines 115_1 to 115_4 are disposed on the periphery of the memory mats 111 to 114. The power-supply trunk lines 115_1 to 115_4 are electrically connected with each other. The power-supply trunk lines 115_1 to 115_4 are lines for supplying electric power to each of the memory mats 111 to 114. The power-supply trunk lines 115_1 to 115_4 are supplied with electric power from a power-supply line(s) disposed in another wiring layer(s) (not shown) through vias 117_1 to 117_4.

Further, power-supply lines 121 to 124 for supplying electric power to the respective memory mats 111 to 114 are disposed in places corresponding to the respective memory mats 111 to 114. The power-supply lines 121 to 124 are electrically connected to the power-supply trunk lines 115_3 and 115_4. For this configuration, there has been a problem that when the longitudinal length of the memory mats 111 to 114 is large, the amount of supplied electrical power decreases in and near the central part 116 of the memory mats 111 to 114. In other words, there has been a problem that when the power-supply lines 121 to 124 are long, the amount of supplied electrical power decreases in and near the center of the power-supply lines 121 to 124.

Therefore, as shown in FIG. 1, it has been necessary to dispose the power-supply line 16 in or near the central part of the memory mats 111 to 114. Therefore, it is conceivable to divide the memory area of the memory cell array and to provide a new wiring area for disposing the power-supply line 16 between the divided memory areas. However, there has been a problem that the chip becomes larger in size.

Accordingly, in the semiconductor storage device 1 according to this embodiment, the memory mat is divided into the memory areas 11_1 and 11_2 and the divided memory areas 11_1 and 11_2 share the common array end (which corresponds to the boundary area 18). Further, a layer located above this shared array end is used as a wiring area. That is, the memory areas 11_1 and 11_2 share the common array end in the boundary area 18, and no data is written into memory cells disposed in this boundary area 18. Consequently, since the line 56 does not need to be used as a signal line for driving any word-line drive circuit WD, the line 56 can be used as the power-supply line 16 shown in FIG. 1. Therefore, the semiconductor storage device according to this embodiment makes it possible to increase the integration density of the memory cell array and provide an additional line in the memory cell array.

Figure 5:
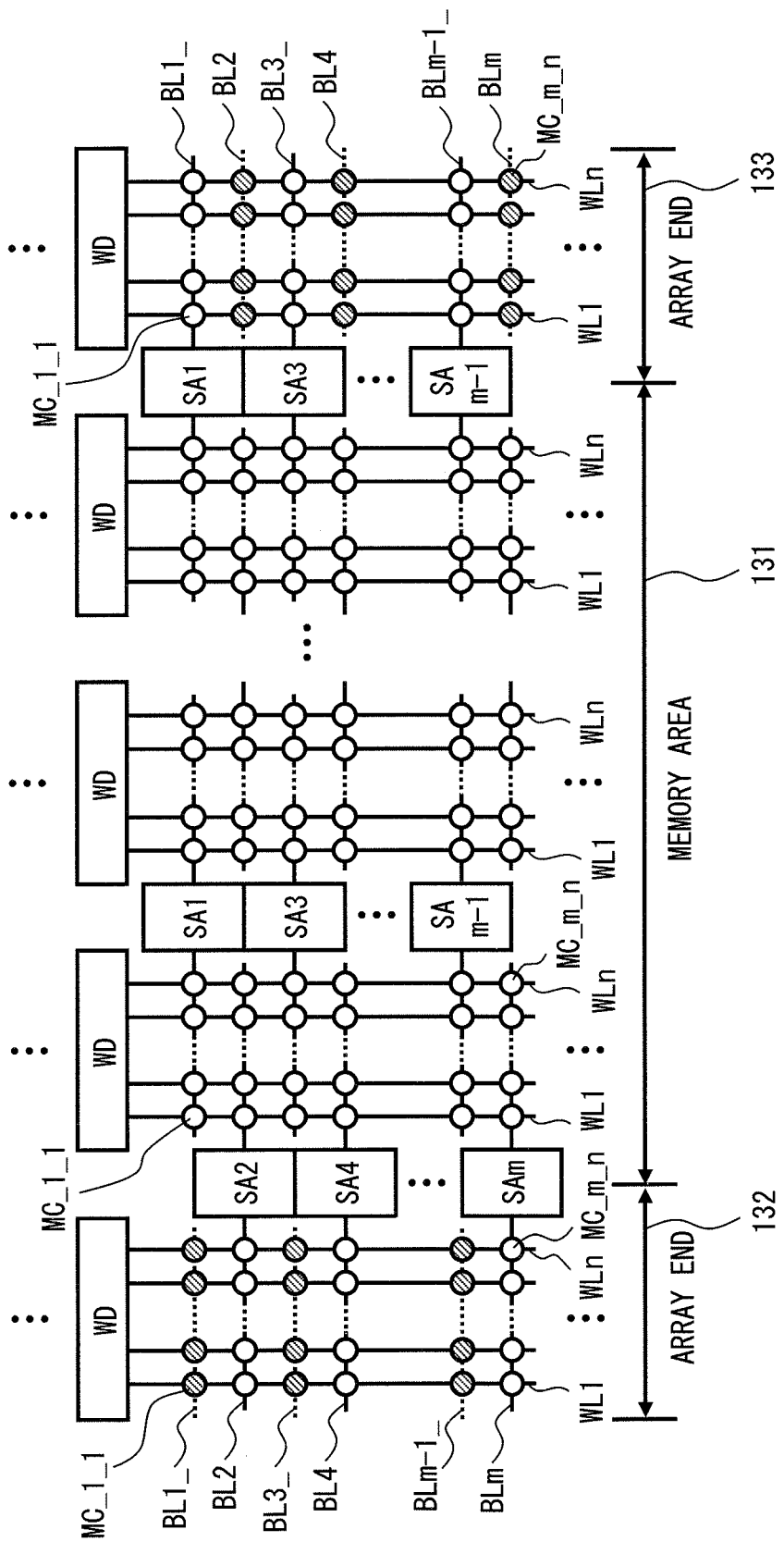
FIG. 5 shows a configuration of a semiconductor storage device according to a comparative example.

FIG. 5 shows a configuration of a semiconductor storage device according to a comparative example. The semiconductor storage device shown in FIG. 5 includes a plurality of unit memory cell arrays explained above with reference to FIG. 2A. That is, each memory cell array includes a plurality of memory cells MC_1_1 to MC_m_n, a plurality of bit lines BL1_, BL2, . . . , BLm, and a plurality of word lines WL1 to WLn. Each of the plurality of memory cells MC_1_1 to MC_m_n is disposed in a place at which one of the bit lines intersects one of the word lines. Note that m and n are arbitrary natural numbers. The number m corresponds to the number of bit lines, and the number n corresponds to the number of word lines. In this example, the number of memory cells disposed in the unit memory cell array 131 is expressed as "m×n".

As shown in FIG. 5, in an open bit-line type memory cell array in which sense amplifiers SA1 to SAm are alternately arranged, array ends 132 and 133 are formed on both sides of a memory area 131. Note that bit lines that are not connected to any sense amplifier are formed in the array ends 132 and 133. That is, bit lines BL1_, BL3_, . . . , BLm−1_ are not connected to any sense amplifier in the array end 132. Further, bit lines BL2, BL4, . . . , BLm are not connected to any sense amplifier in the array end 133.

Figure 6:
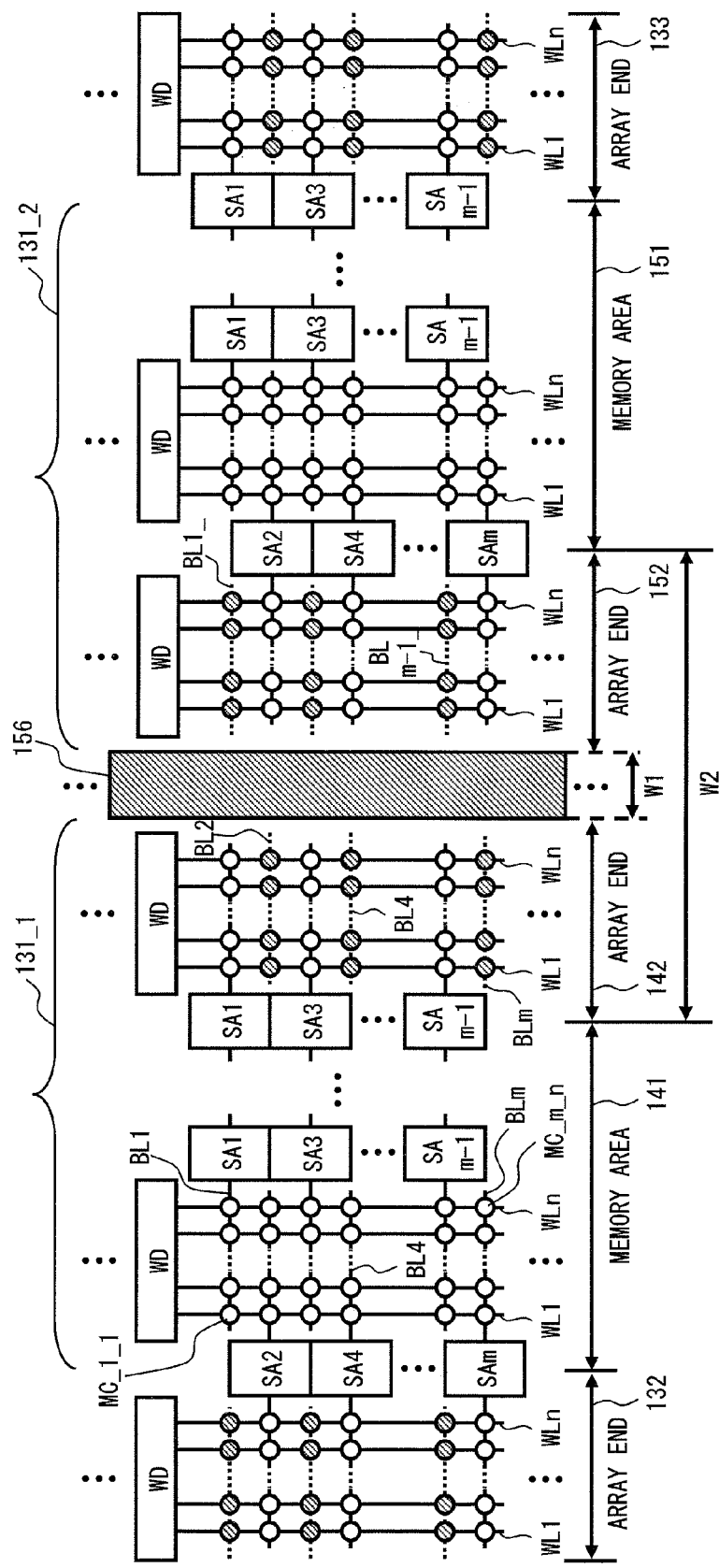
FIG. 6 shows a configuration of a semiconductor storage device according to a comparative example.

Further, in the semiconductor storage device shown in FIG. 5, when the memory area 131 is divided and a wiring area is formed between the divided memory areas, the semiconductor storage device has a configuration shown in FIG. 6. That is, as shown in FIG. 6, when the memory area 131 is divided into areas 131_1 and 131_2, a memory area 141 and an array end 142 are newly formed in the area 131_1 and a memory area 151 and an array end 152 are newly formed in the area 131_2.

Similarly to the above-described configuration, bit lines that are not connected to any sense amplifier are formed in the array ends 142 and 152. That is, bit lines BL2, BL4, . . . , BLm are not connected to any sense amplifier in the array end 142. Further, bit lines BL1_, BL3_, . . . , BLm−1_ are not connected to any sense amplifier in the array end 152.

Further, when a new line 156 is provided in the memory area 131, the line 156 is disposed between the areas 131_1 and 131_2, i.e., between the array ends 142 and 152. Therefore, when a line 156 having a width W1 is provided, it is necessary to secure a width W2 that is obtained by adding up the width W1 of the line 156, the width of the array end 142, and the width of the array end 152. As a result, there has been a problem that the memory cell array becomes larger in size.

Therefore, in the semiconductor storage device 1 according to this embodiment, as shown in FIG. 3, the memory areas 11_1 and 11_2 share their array end and a layer located above this shared array end is used as a wiring area. That is, the memory areas 11_1 and 11_2 share the common array end in the boundary area 18, and no data is written into the memory cells disposed in this boundary area 18. Consequently, since the line 56 does not need to be used as a signal line for driving any word-line drive circuit WD, the line 56 can be used as the power-supply line 16 shown in FIG. 1. Therefore, the semiconductor storage device according to this embodiment makes it possible to increase the integration density of the memory cell array and provide an additional line in the memory cell array.

Further, in the semiconductor storage device 1 according to this embodiment, all the bit lines disposed in the boundary area 18 are connected to the sense amplifiers SA1 to SAm. Therefore, when data written into a memory cell array adjacent to the boundary area 18 is read by using the sense amplifiers SA1 to SAm, the sense amplifiers SA1 to SAm can generate a reference signal (s) by using a bit line(s) disposed in the boundary area 18. As a result, it is possible to effectively use the bit lines disposed in the boundary area 18.

Note that in the above-explained semiconductor storage device 1 according to this embodiment, a case where the line 56 is used as a power-supply line is explained. However, the line 56 may be used as a signal line other than the power-supply line. For example, the line 56 may be used as a line for supplying a signal (e.g., test-mode signal) that is commonly used in each of the memory mats 11 to 14 (see FIG. 1).

Second Embodiment

Figure 7:
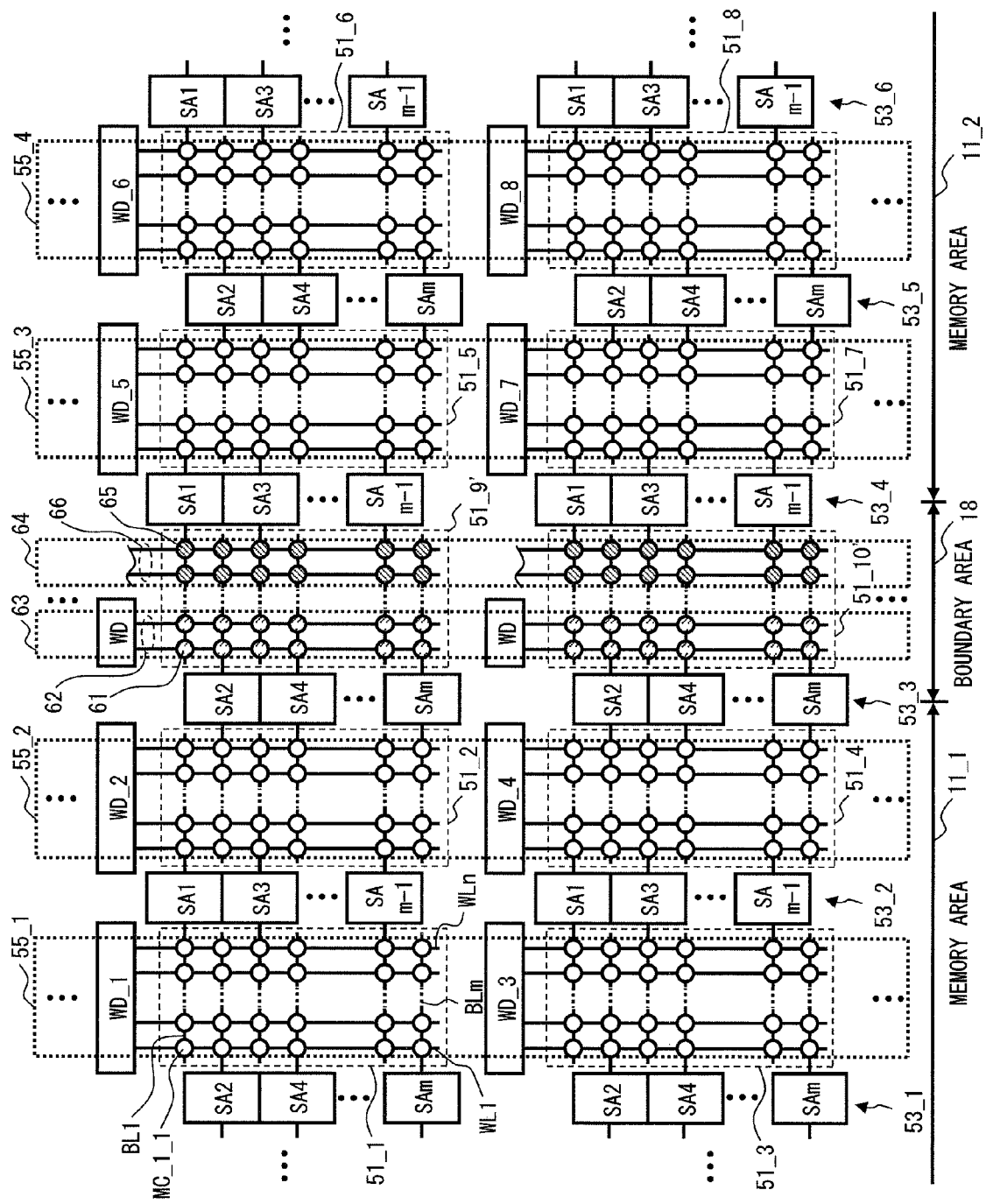
FIG. 7 shows a configuration of a semiconductor storage device according to a second embodiment.

Next, a second embodiment is explained. FIG. 7 shows a configuration of a semiconductor storage device according to a second embodiment, and corresponds to FIG. 3 in the first embodiment. The semiconductor storage device according to this embodiment is different from the semiconductor storage device according to the first embodiment in that some of the memory cells disposed in the boundary area 18 are used as reserve memory cells. The semiconductor storage device according to this embodiment is substantially the same as the semiconductor storage device according to the first embodiment except for this difference. Therefore, the same symbols are assigned to the same components and their duplicated explanation is omitted.

As shown in FIG. 7, memory cell arrays 51_9' and 51_10' are disposed in the boundary area 18 between the memory areas 11_1 and 11_2. The memory cell arrays 51_9' and 51_10' are arranged side by side in the direction parallel to the word lines WL1 to WLn. Further, the memory cell arrays 51_9' and 51_10' are disposed so as to be sandwiched between the sense amplifier groups 53_3 and 53_4.

Among the word lines 62 and 66 of the memory cell array 51_9' disposed in the boundary area 18, the word lines 62 (third word lines) are connected to a word-line drive circuit WD (third word-line drive circuit). Therefore, data can be written into the memory cells (reserve memory cells) 61 connected to the word lines 62. On the other hand, among the word lines 62 and 66 of the memory cell array 51_9' disposed in the boundary area 18, the word lines 66 are kept in an inactive state at all operation modes. Therefore, no data is written into the memory cells 65 connected to the word lines 66. The memory cell array 51_10' is configured in a similar manner.

Further, the bit lines BL1, BL2_, . . . , BLm_ of the memory cell arrays 51_9' and 51_10' disposed in the boundary area 18 are connected to the sense amplifiers SA1 to SAm. Therefore, the sense amplifiers SA1 to SAm can write data into the memory cell 61 and read data stored in the memory cells 61.

Further, the bit lines BL1, BL2_, . . . , BLm_ are used to generate reference signals when the sense amplifiers SA1 to SAm read data from the memory cell arrays 51_2, 51_4, 51_5 and 51_7.

Further, a line 63 (third line) is formed in a place corresponding to the reserve memory cells 61 of the memory cell arrays 51_9' and 51_10'. The line 63 is formed in a different layer from the layer in which the memory cell arrays 51_9' and 51_10' are formed. For example, the line 63 is formed in a wiring layer that is formed above the layer in which the word lines and the bit lines are formed. The line 63 is formed so as to pass through the memory mats 11 to 14 (see FIG. 1). For example, the line 63 is a signal line for supplying a word-line drive signal to word-line drive circuits WD (i.e., a plurality of word-line drive circuits arranged in the direction parallel to the word line 62).

Further, a line 64 (first line) is formed in a place corresponding to memory cells 65 of the memory cell arrays 51_9' and 51_10'. The line 64 is formed in a different layer from the layer in which the memory cell arrays 51_9' and 51_10' are formed. That is, the line 64 is formed in a place that overlaps the memory cells 65 into which no data is written. For example, the line 64 is formed in a wiring layer that is formed above the layer in which the word lines and the bit lines are formed. The line 64 is formed so as to pass through the memory mats 11 to 14 (see FIG. 1). The line 64 can be used as the power-supply line 16 shown in FIG. 1.

That is, in the semiconductor storage device according to this embodiment, when it is unnecessary to form the line 64 used as the power-supply line over the entire boundary area 18, i.e., when the line 64 has enough capability as the power-supply line, the reserve memory cells 61 are provided in part of the boundary area 18. The reserve memory cells 61 are memory cells that are used, when a failure(s) occurs in a memory cell(s) disposed in the memory areas 11_1 and 11_2, as a substitute for the failed memory cell(s). When the memory cells 61 are used, a word-line drive signal is supplied to the word-line drive circuit WD through the line 63. By constructing the semiconductor storage device with redundancy as described above, the reliability of the semiconductor storage device can be improved. Further, the boundary area 18 can be used without any waste.

As a typical example, the total number of the word lines 62 connected to the reserve memory cells 61 and the word lines 66 connected to the unused memory cells 65 can be equal to the number n of the word lines of the unit memory cell arrays disposed in the memory areas 11_1 and 11_2. However, the number of the word lines 62 connected to the reserve memory cells 61 may be arbitrarily determined. That is, there are no particular restrictions on the area other than the area in which the line 64 is disposed. That is, an arbitrary number of memory cells 61 can be disposed in that area.

Note that in this embodiment, a case where the line 64 is used as a power-supply line is also explained. However, the line 64 may be used as a signal line other than the power-supply line. For example, the line 64 may be used as a line for supplying a signal (e.g., test-mode signal) that is commonly used in each of the memory mats 11 to 14 (see FIG. 1).

The present invention made by the inventors has been explained above in a specific manner based on embodiments. However, the present invention is not limited to the above-described embodiments, and needless to say, various modifications can be made without departing from the spirit and scope of the present invention.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor storage device, comprising:
   a first and a second memory region, each of the first and second memory region including a plurality of memory cell array units;
   a first memory cell array unit in the first memory region having a plurality of first sense amplifiers, a plurality of first bit line pairs extending both sides of the first sense amplifiers, and a plurality of first memory cells connected to the first bit line pairs;

a second memory cell array unit in the second memory region having a plurality of second sense amplifiers, a plurality of second bit line pairs extending both sides of the second sense amplifiers, and a plurality of second memory cells connected to the second bit line pairs;

a first power supply line arranged to surround the first and second memory region;

a second power supply line extending in a word-line direction and being connected to the first power supply line;

wherein one of the first bit line pairs and one of the second bit line pairs are alternately provided in the word-line direction between the first and second sense amplifiers, wherein first word lines connected to the first memory cells and the second memory cells between the first and second sense amplifiers are in an inactivate state, and wherein the second power supply line is formed between the first and second sense amplifiers so as to overlap the first and second memory cells between the first and second sense amplifiers in plane view.

2. The semiconductor storage device according to claim 1, wherein the first word lines are in inactivate state at all operation modes.

3. The semiconductor storage device according to claim 1, wherein the first word lines are connected to a low-potential side power-supply line.

4. The semiconductor storage device according to claim 1, wherein the first and second memory cells disposed between the first and second sense amplifiers further includes a plurality of reserve memory cells used for replacement of a defective memory cell, the reserve memory cells are connected to second word lines different from the first word lines.

5. The semiconductor storage device according to claim 1, wherein the first bit line pairs and the second bit line pairs provided between the first and second sense amplifiers are used to generate a reference signal when the first and second sense amplifiers read data from the first and second memory cells.

* * * * *